US 8,778,735 B1

(12) United States Patent
Xue et al.

(10) Patent No.: US 8,778,735 B1
(45) Date of Patent: Jul. 15, 2014

(54) PACKAGING METHOD OF MOLDED WAFER LEVEL CHIP SCALE PACKAGE (WLCSP)

(71) Applicants: Yan Xun Xue, Los Gatos, CA (US); Hamza Yilmaz, Saratoga, CA (US); Yueh-Se Ho, Sunnyvale, CA (US); Jun Lu, San Jose, CA (US); Ping Huang, Shanghai (CN); Lei Shi, Shanghai (CN); Lei Duan, Shanghai (CN); Yuping Gong, Shanghai (CN)

(72) Inventors: Yan Xun Xue, Los Gatos, CA (US); Hamza Yilmaz, Saratoga, CA (US); Yueh-Se Ho, Sunnyvale, CA (US); Jun Lu, San Jose, CA (US); Ping Huang, Shanghai (CN); Lei Shi, Shanghai (CN); Lei Duan, Shanghai (CN); Yuping Gong, Shanghai (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/931,854

(22) Filed: Jun. 29, 2013

(51) Int. Cl.
*H01L 21/00* (2006.01)
*H01L 21/304* (2006.01)
*H01L 21/78* (2006.01)

(52) U.S. Cl.
CPC .......... *H01L 21/304* (2013.01); *H01L 21/3043* (2013.01); *H01L 21/78* (2013.01); *Y10S 438/977* (2013.01)
USPC ........... 438/114; 438/106; 438/691; 438/464; 438/455; 438/459; 438/462; 438/977; 438/112; 438/460; 257/622; 257/773

(58) Field of Classification Search
USPC ......... 438/460, 106, 114, 691, 464, 455, 459, 438/462, 977, 112; 257/622, 773
See application file for complete search history.

(56) References Cited

U.S. PATENT DOCUMENTS

| 6,949,434 | B2* | 9/2005 | Okabe et al. | 438/268 |
| 7,776,647 | B2* | 8/2010 | Farnworth et al. | 438/106 |
| 8,563,361 | B2* | 10/2013 | Xue et al. | 438/112 |
| 8,710,648 | B2* | 4/2014 | Xue | 257/698 |
| 2006/0211170 | A1* | 9/2006 | Oyu et al. | 438/106 |
| 2010/0009519 | A1* | 1/2010 | Seddon et al. | 438/464 |
| 2013/0037917 | A1* | 2/2013 | Xue | 257/621 |

* cited by examiner

*Primary Examiner* — Evan Pert
*Assistant Examiner* — Gustavo Ramallo
(74) *Attorney, Agent, or Firm* — Chein-Hwa Tsao; CH Emily LLC

(57) ABSTRACT

A WLCSP method comprises: depositing a metal bump on bonding pads of chips; forming a first packaging layer at front surface of wafer to cover metal bumps while forming an un-covered ring at the edge of wafer to expose the ends of each scribe line located between two adjacent chips; thinning first packaging layer to expose metal bumps; forming a groove on front surface of first packaging layer along each scribe line by cutting along a straight line extended by two ends of scribe line exposed on front surface of un-covered ring; grinding back surface of wafer to form a recessed space and a support ring at the edge of the wafer; depositing a metal layer at bottom surface of wafer in recessed space; cutting off the edge portion of wafer; and separating individual chips from wafer by cutting through first packaging layer, the wafer and metal layer along groove.

10 Claims, 5 Drawing Sheets

PACKAGING METHOD OF MOLDED WAFER LEVEL CHIP SCALE PACKAGE (WLCSP)

CROSS-REFERENCE TO RELATED APPLICATIONS

This Patent Application is a Continuation Application of a co-pending application Ser. No. 13/547,358 filed on Jul. 12, 2012 by a common inventor of this Application. The Disclosure made in the patent application Ser. No. 13/547,358 is hereby incorporated by reference.

FIELD OF THE INVENTION

This invention relates to a packaging method of semiconductor devices. Particularly, this invention aims at providing an improved WLCSP method for obtaining thin chip packages with molding compound on both front side and backside to protect the device from damaging during treatment in a packaging step of the wafer-level chips as well as improving the mechanical strength of wafers.

DESCRIPTION OF THE RELATED ART

In a wafer level chip scale package (WLCSP) technology, the semiconductor chip is packaged directly on the wafer level after the semiconductor chips are finished completely on the wafer following by the separation of individual chip packages from the wafer. As a result, the size of the chip package is almost equal to the size of the original semiconductor chip. Conventionally, the WLCSP technology is widely used for the semiconductor devices. As well known in the art, vertical power device has larger Rdson. Therefore, the wafer is thinned to reduce the substrate resistance, thus Rdson is reduced. However, as the wafer is thinner, it is difficult to treat and handle the thin wafer due to lack of the mechanical protection.

In addition, in the conventional chip scale packaging technology, the wafer is directly cut along the scribe line at the front surface of the wafer to separate individual chip packages from the wafer. However, the front surface of the wafer is usually packaged with a molding compound before the wafer is thinned to enhance the mechanical support for the wafer to prevent the thinned wafer from cracking. As a result, the scribe line is covered by the molding compound. Therefore, it is difficult to cut the wafer along the scribe line at the front surface of the wafer.

Given the above description of related prior arts, therefore, there is a need to manufacture ultra thin chips by WLCSP and to apply these chips in power devices.

BRIEF DESCRIPTION OF THE DRAWINGS

As shown in attached drawings, the embodiment of the invention is more sufficiently described. However, the attached drawing is only used for explaining and illustrating rather than limiting the range of the invention.

DETAILED DESCRIPTION OF THE PREFERRED EMBODIMENTS

Figure 1A:
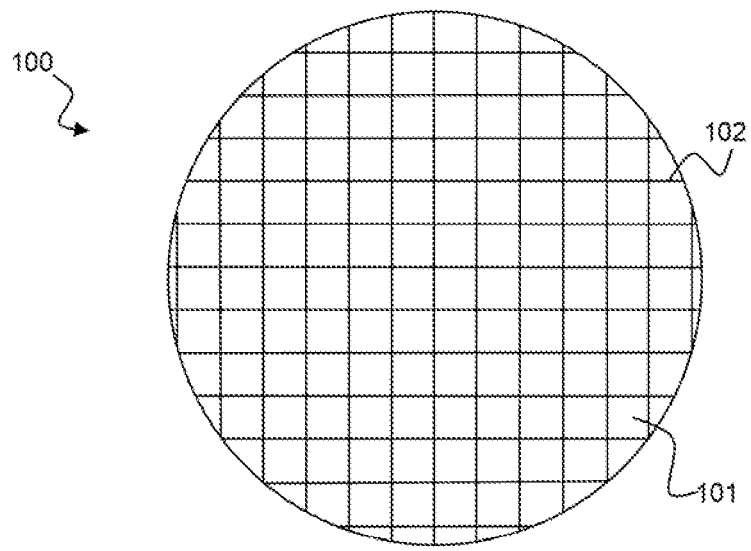
FIG. 1A is a top view of the front surface of a semiconductor wafer having semiconductor chips formed thereon.

FIG. 1A is a top view of a wafer 100 including a plurality of semiconductor chips 101 formed on the front surface of the wafer with each scribe line 102 located between two adjacent chips 101. It is well known in the art that individual chip 101 is separated from the wafer 100 by cutting along the scribe line 102. Generally, a plurality of metal bonding pads (not shown) are formed on the front surface of each chip 101 forming the electrodes of the chip, which connect to the power supply, the ground or a terminal for signal transmission with an external circuit.

Figure 1B:
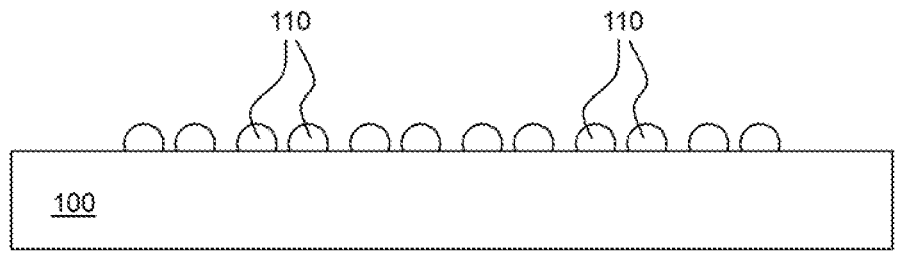
FIG. 1B is a cross-sectional schematic diagram of the semiconductor wafer having metal bump formed on the semiconductor chip's metal bonding pad.

As shown in FIG. 1B, metal bumps 110 are formed on each metal bonding pad at the front surface of each chip 101. The metal bump 110 can be made of copper, gold, silver, aluminum and the like or their alloy. The metal bump 110 can have a shape of sphere, ellipse, cube, cylinder, or wedge and the like.

Figure 2A:
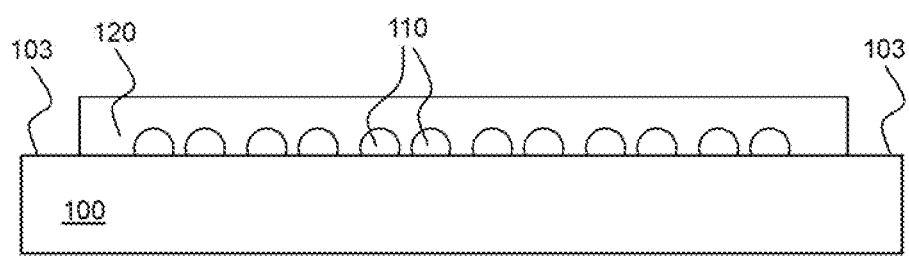
FIGS. 2A-2B are schematic diagrams illustrating the step of depositing a first packaging layer to cover the front surface of the wafer.
Figure 2B:
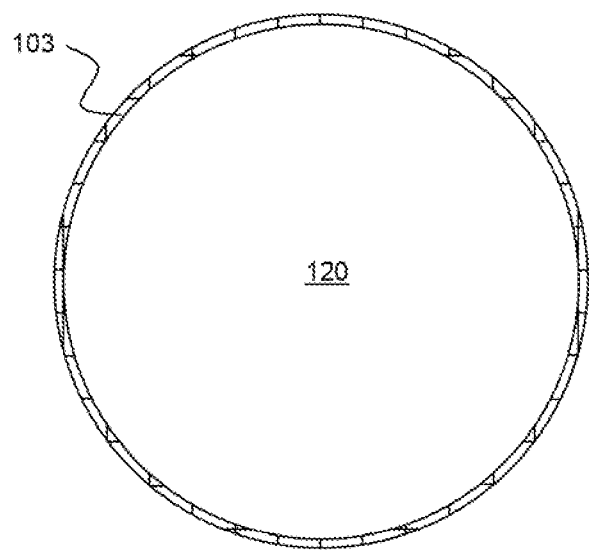

As shown in FIG. 2A, a packaging material, such as epoxy resin and the like, is deposited to form a first packaging layer 120 with a certain thickness covering the front surface of the wafer 100 and all metal bumps 110. As shown in FIGS. 2A and 2B, the radius of the first packaging layer 120 is slightly smaller than the radius of the wafer 100, as such the first packaging layer 120 does not cover the whole front surface of the wafer 100, for example, an un-covered ring 103 close to the edge of the wafer is not covered by the first packaging layer 120.

Figure 3A:
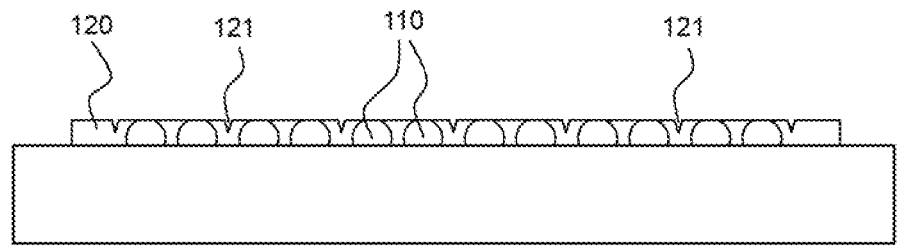
FIGS. 3A-3B are schematic diagrams illustrating steps of grinding to thin the first packaging layer and forming cutting grooves on the first packaging layer.
Figure 3B:
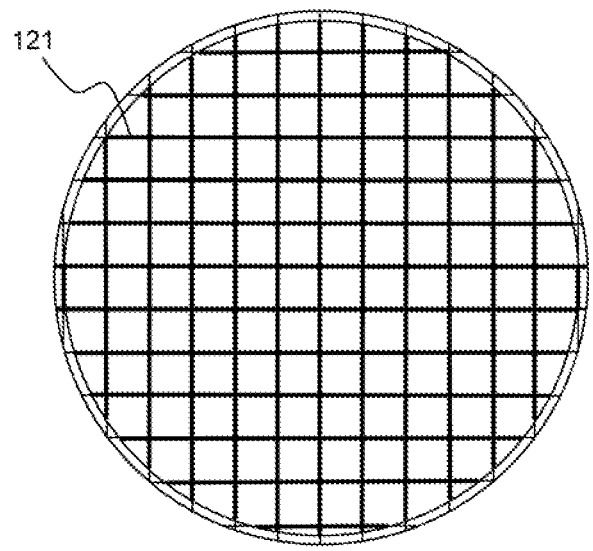

As shown in FIG. 3A, the first packaging layer 120 is ground to expose the metal bumps 110. The metal bump 110 is preferably made of copper to eliminate the unexpected contamination at the grinding surface of the first packaging layer 120 when the dust from the metal bump is adhered on the grinding wheel while grinding the first packaging layer. In FIG. 3A, a plurality of cutting grooves 121 are then formed on the front surface of the thinned first packaging layer 120. As shown in FIG. 2B, the radius of the first plastic packaging layer 120 is smaller than the radius of the wafer 100 to ensure that the two ends of each scribe line 102 in the un-covered ring 103 is not covered by the first plastic packaging layer 120. The cutting groove 121 can be formed by cutting a shallow line on the front surface of the first packaging layer 120, which is aligned with a scribe line 102 extending from its two ends exposed in the un-covered ring 103. Particularly, each shallow line or cutting groove 121 is overlapped with the corresponding scribe line 102 as shown in FIG. 3B. The depth of the cutting groove 121 can be adjusted. In one embodiment, the cutting groove 121 can penetrate through the first packaging layer 120 to the front surface of the wafer.

Figure 4:
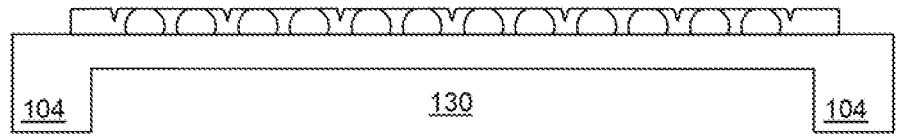
FIG. 4 is a cross-sectional schematic diagram illustrating the step of grinding to thin the wafer from its back surface.

As shown in FIG. 4, the wafer 100 is ground at its back surface to a predetermined thickness. To provide a mechanical support for the thinned wafer, a support ring at the edge of the wafer is not ground. As shown in FIG. 4, a recessed space 130 is formed by grinding the back surface of the wafer 100 with a grinding wheel having a radius smaller than the radius of the wafer 100. The radius of the recessed space 130 is as large as possible to maximize the yield of chips formed close to the edge of the wafer. In this step, a support ring 104 at the edge of the wafer 100 is formed and the width of the support ring 104 is the difference between the radius of the wafer 100 and the radius of the recessed space 130. In this step, the designed thickness of the thin wafer 100 can be adjusted by the depth of the recessed space 130. The support ring 104 and the thinned packaging layer 120 provide a mechanical support for the thinned wafer 100, thus the thinned wafer is not easy to crack. In one embodiment, the radius of the recessed space 130 is smaller than the radius of the first packaging layer 120 in order to further maintain the mechanical strength of the thinned wafer 100, so that a portion of the first packaging layer 120 can be partially overlapped with a portion of the support ring 104.

Figure 5:
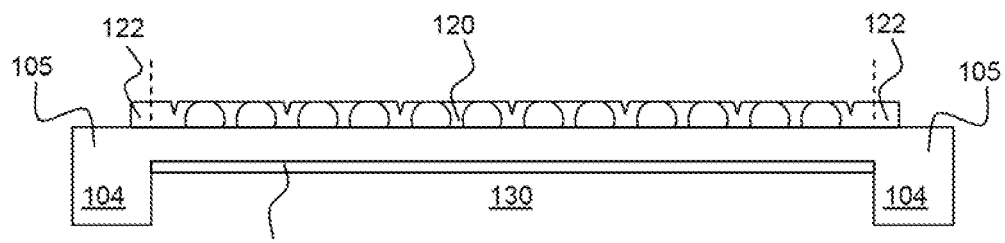
FIG. 5 is a cross-sectional schematic diagram illustrating the step of depositing a metal layer at the bottom surface of the thinned wafer.
Figure 6:
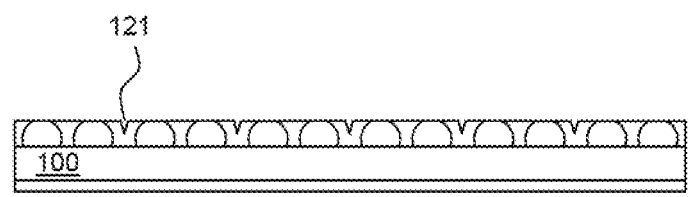
FIG. 6 is a cross-sectional schematic diagram illustrating the step of cutting the edge portion of the wafer.
Figure 7:
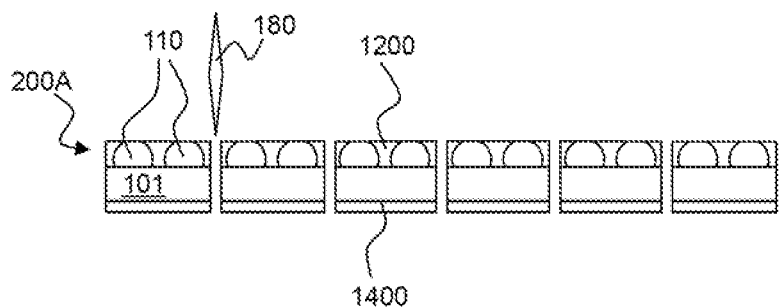
FIG. 7 is a cross-sectional schematic diagram illustrating the step of separating individual packaging structures by cutting through the first packaging layer, the wafer and the metal layer.

As shown in FIG. 5, optionally, dopants are heavily doped at the bottom surface of the wafer 100 exposed inside the recessed space 130 followed by the annealing for dopants to diffuse. Then, a metal layer 140 is deposited at the bottom surface of the wafer 100. As shown in FIG. 5 and FIG. 6, the edge portion 105 of the thinned wafer 100 and the support ring 104 are cut off, as such the overlapped part 122 of the first packaging layer 120 is also cut off with the width of the cut portion 105 of the wafer being equal to or slightly greater than the width of the support ring 104. As shown in FIG. 6 and FIG. 7, the first packaging layer 120, the wafer 100 and the metal layer 130 can be cut through by a cutter 180 along the cutting groove 121 to separate individual chips 101 from the wafer 100. As a result, the first packaging layer 120 can be cut into a plurality of top packaging layers 1200, and the metal layer 140 can be cut into a plurality of bottom metal layers 1400, thus a plurality of wafer-level packaging structures 200A are obtained. Each packaging structure 200A includes a top packaging layer 1200 covering the front surface of each chip 101 and a bottom metal layer 1400 covering the back surface of the chip 101 with the metal bump 110 exposed out from the top packaging layer 1200 functioning as a contact terminal of the packaging structure 200A to electrically connect the external circuit.

In one embodiment, the chip 101 is a vertical MOSFET (Metal-Oxide-Semiconductor Field Effect Transistor), in which the current flows from the front surface to the back surface of the chip or vice versa. As such, the plurality of metal bonding pads formed at the front surface of the chip includes a bonding pad forming a source electrode and a bonding pad forming a gate electrode, and the bottom metal layer 1400 forms the drain electrode of the chip. As the thickness of the chip 101 is equal the thickness of the thinned wafer 100, the resistance of the chip 101 can be greatly reduced.

Figure 8A:
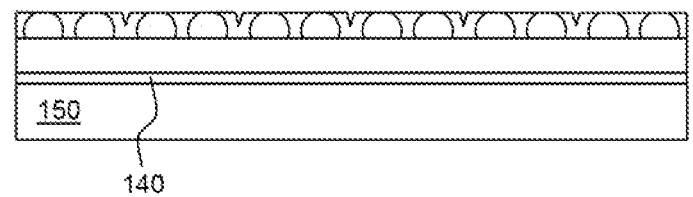
FIGS. 8A-8B are cross-sectional schematic diagrams illustrating the steps of forming a second packaging layer on the metal layer.
Figure 8B:
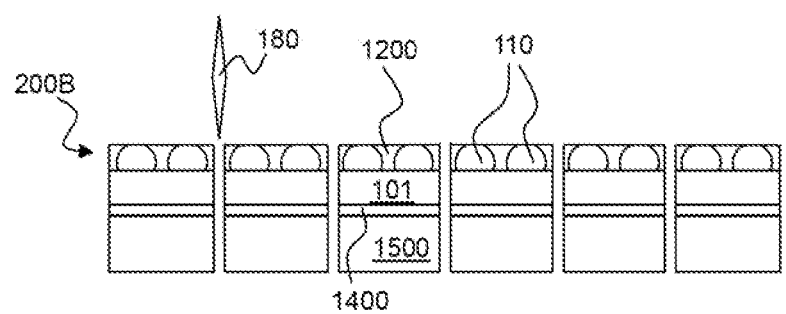

In another embodiment, a packaging structure 200B with a bottom packaging layer 1500 can be formed as shown in FIGS. 8A-8B. After the edge portion 105 of the thinned wafer, the overlapped part 122 and the support ring 104 are cut of as shown in FIG. 6, a second packaging layer 150 is formed to cover the metal layer 140 as shown in FIG. 8A. Then the first packaging layer 120, the wafer 100, the metal layer 130 and the second packaging layer 150 are cut to separate individual chips 101 from the wafer 100. As a result, the first packaging layer 120 is cut into a plurality of top packaging layers 1200, the metal layer 140 is cut into a plurality of bottom metal layers 1400 and the second packaging layer 150 is cut into a plurality of bottom packaging layer 1500, thus a plurality of packaging structures 200B are obtained. Each packaging structure 200B includes a top packaging layer 1200 covering the front surface of the chip 101, a bottom metal layer 1400 covering the back surface of the chip 101, and a bottom packaging layer 1500 covering the bottom metal layer 1400 with the metal bump 110 exposed out of the top packaging layer 1200 functioning as a contact terminal of the packaging structure 200B for electrically connecting with the external circuit. In this embodiment, since the bottom metal layer 1400 is covered by the bottom packaging layer 1500, the bottom metal layer 1400 cannot be used as the contact terminal for connecting with the external circuit. As such, when the chip 101 is a vertical MOSFET, the plurality of metal bonding pads formed at the front surface of the chip include a bonding pad forming a source electrode, a bonding pad forming a gate electrode, and bonding pads electrically connecting to the bottom metal layer 1400 forming the drain electrode through a metal interconnecting structure (not shown) formed in the chip.

Figure 9A:
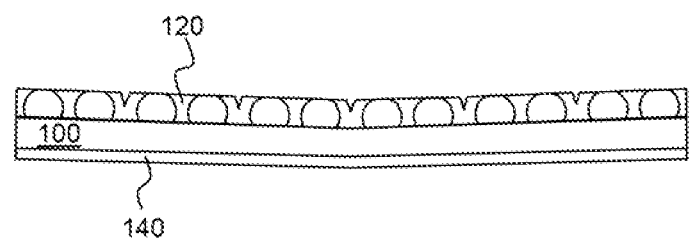
FIGS. 9A-9C are cross-sectional schematic diagrams illustrating alternative steps of forming the second packaging layer on the metal layer.
Figure 9B:
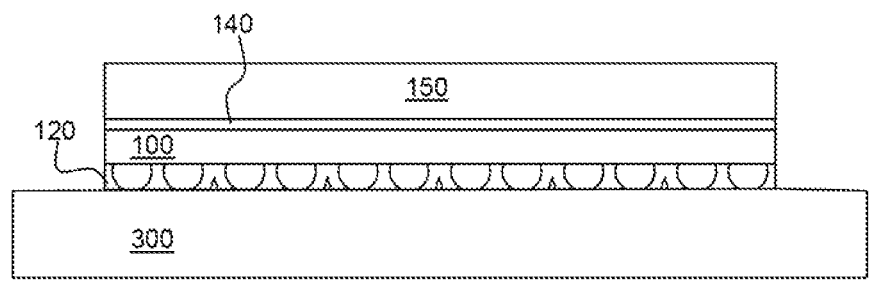
Figure 9C:
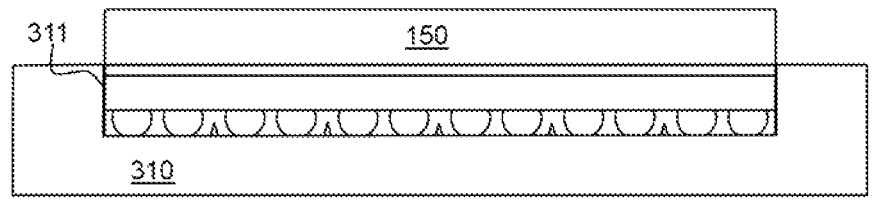

As shown in FIG. 9A, before forming the second packaging layer 150, as the wafer 100 is very thin, the wafer 100 with the metal layer 140 and the first packaging layer 102 are easy to warp. To avoid the warping of the thinned wafer, as shown in FIG. 9B, the wafer 100 with the metal layer 140 and the first packaging layer 120 are placed on a heating plate 300 with the first packaging layer 120 directly contacting to the heating plate 300. After the wafer with the metal layer 140 and the first packaging layer 102 is heated and flattens out, the second packaging layer 150 is formed on the metal layer 140. Alternatively, as shown in FIG. 9C, a heating plate 310 can include a recessed space 311 with a depth approximately equal to the sum of the thickness of the metal layer 140, the first packaging layer 120 and the wafer 100 and a radius slightly greater than the radius of the wafer 100 after the edge portion 105 being cut off. The wafer 100 with the metal layer 140 and the first packaging layer 120 is placed inside the recessed space 311 of the heating plate 310 with the first packaging layer 120 directly contacting to the heating plate 310, thus the second packaging layer 150 is formed on the metal layer 140 after it flattens out by heating.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A WLCSP method for packaging semiconductor chips formed at a front surface of a semiconductor wafer, each semiconductor chip comprising a plurality of metal bonding pads formed at its front surface, comprising the steps of:

depositing a metal bump on each of the metal bonding pads;

forming a first packaging layer at the front surface of the wafer to cover the metal bump, wherein the radius of the first packaging layer is smaller than the radius of the wafer forming an un-covered ring at the edge of the wafer, wherein two ends of each scribe line located between two adjacent semiconductor chips extend on a front surface of the un-covered ring;

thinning the first packaging layer to expose the metal bump from the first packaging layer;

forming a cutting groove on the front surface of the thinned first packaging layer along each scribe line by cutting on the first packaging layer along a straight line extended by the two ends of the scribe line exposed on the front surface of the un-covered ring such that a depth of the cutting groove is shallower than a thickness of the thinned first packaging layer;

grinding at the back surface of the wafer to form a recessed space at the back surface of the wafer and a support ring at the edge of the wafer;

depositing a metal layer at the bottom surface of the wafer in the recessed space;

cutting off the edge portion of the wafer; and separating individual semiconductor chips from the wafer by cutting through the first packaging layer, the wafer and the metal layer along the cutting groove, wherein the first packaging layer is cut into a plurality of top packaging layers each of which covers the front surface of each semiconductor chip with the metal bump exposed from the top packaging layer, and wherein the metal layer is cut into a plurality of bottom metal layers each of which covers the back surface of each semiconductor chip.

2. The WLCSP method of claim 1, wherein the cutting groove extends to the front surface of the wafer.

3. The WLCSP method of claim 1, wherein cutting the edge portion of the wafer comprises cutting off the support ring.

4. The WLCSP method of claim 3, wherein a radius of the recessed space is smaller than the radius of the first packaging layer so that a portion of the first packaging layer is overlapped with a portion of the support ring, and wherein cutting off the edge portion of the wafer comprises cutting off the support ring and the overlapped portion of the first packaging layer.

5. The WLCSP method of claim 1 further comprising heavily doping dopants at the bottom surface of the wafer in the recessed space before depositing the metal layer.

6. The WLCSP method of claim 1, wherein the recessed space is formed by a grinding wheel with the radius smaller than the radius of the wafer.

7. The WLCSP method of claim 1, after cutting off the edge portion of the wafer, further comprising forming a second packaging layer on the metal layer, wherein separating individual semiconductor chips from the wafer comprises cutting through the first packaging layer, the wafer, the metal layer and the second packaging layer along the cutting groove, wherein the second packaging layer is cut into a plurality of bottom packaging layers each of which covers on the bottom metal layer of each semiconductor chip.

8. The WLCSP method of claim 7, wherein forming the second packaging layer on the metal layer comprises:

placing the thinned wafer having the first packaging layer covering its front surface and the metal layer covering its back surface on a heating plate with the first packaging layer directly contacting to the heating plate;

heating the wafer, the first packaging layer and the metal layer until the wafer, the first packaging layer and the metal layer flatten out; and forming the second packaging layer on the flattened metal layer.

9. The WLCSP method of claim 7, wherein forming the second packaging layer on the metal layer comprises:

placing the thinned wafer having the first packaging layer covering its front surface and the metal layer covering its back surface inside a recessed space of a heating plate with the first packaging layer directly contacting to the heating plate;

heating the wafer, the first packaging layer and the metal layer until the wafer, the first packaging layer and the metal layer flatten out; and forming the second packaging layer on the flattened metal layer.

10. The WLCSP method of claim 9, wherein a depth of the recessed space of the heating place is the same as the total thickness of the wafer, the first packaging layer and the metal layer and a radius of the recessed space is slightly larger than the radius of the wafer after cutting off the edge portion.

* * * * *